(12) United States Patent
Glahn et al.

(10) Patent No.: US 7,952,873 B2
(45) Date of Patent: May 31, 2011

(54) PASSIVE CONDUCTIVE COOLING MODULE

(75) Inventors: Timothy J. Glahn, Burke, VA (US);
Robert G. Kurtz, Jr., Fairfax, VA (US)

(73) Assignee: Raytheon Company, Waltham, MA (US)

( * ) Notice: Subject to any disclaimer, the term of this patent is extended or adjusted under 35 U.S.C. 154(b) by 381 days.

(21) Appl. No.: 11/426,435

(22) Filed: Jun. 26, 2006

(65) Prior Publication Data

US 2007/0297137 A1 Dec. 27, 2007

(51) Int. Cl.
*H05K 7/20* (2006.01)
*F28F 7/00* (2006.01)
*H01L 23/34* (2006.01)

(52) U.S. Cl. . 361/699; 165/80.4; 165/80.5; 165/104.33; 165/46; 165/170; 174/15.1; 257/714

(58) Field of Classification Search .......... 361/698–702, 361/711, 679.53; 165/80.4–80.5, 104.33, 165/185; 174/15.1, 15.2, 252; 257/714
See application file for complete search history.

(56) References Cited

U.S. PATENT DOCUMENTS

| | | | | |
|---|---|---|---|---|
| 4,700,272 A | * | 10/1987 | Bellamy | 361/699 |
| 4,938,279 A | * | 7/1990 | Betker | 165/46 |
| 4,994,937 A | * | 2/1991 | Morrison | 361/715 |
| 5,205,348 A | * | 4/1993 | Tousignant et al. | 165/46 |
| 5,245,508 A | * | 9/1993 | Mizzi | 361/694 |
| 5,285,347 A | * | 2/1994 | Fox et al. | 361/699 |
| 5,504,924 A | | 4/1996 | Ohashi et al. | |
| 5,720,338 A | * | 2/1998 | Larson et al. | 165/46 |
| 5,740,018 A | * | 4/1998 | Rumbut, Jr. | 361/720 |
| 6,690,578 B2 | * | 2/2004 | Edelmann | 361/699 |
| 7,167,366 B2 | * | 1/2007 | Cheon | 361/699 |
| 2005/0262871 A1 | * | 12/2005 | Bailey-Weston | 62/457.2 |

FOREIGN PATENT DOCUMENTS

| | | |
|---|---|---|
| DE | 41 02 350 A1 | 7/1992 |
| DE | 4102350 A1 | 7/1992 |
| WO | WO 00/04752 A | 1/2000 |
| WO | WO 00/04752 A1 | 1/2000 |

OTHER PUBLICATIONS

Notification of Transmittal of the International Search Report and the Written Opinion of the International Searching Authority, or the Declaration dated Jan. 29, 2008.
"Inflatable Internal Computer Structure" IBM Technical Disclosure Bulletin, IBM Corp. New York, US. vol. 39, No. 1, Jan. 1996, pp. 309-312, XP000556414. ISSN: 0018-8689.
Notification Concerning Transmittal of International Preliminary Report on Patentability (Chapter 1 of the Patent Cooperation Treaty), PCT/US2007/013227 dated Jan. 15, 2009.
Singapore Search and Examination Report for Application No. 200809064-9, from which present U.S. Application claims priority, 11 pages, Oct. 8, 2010.

* cited by examiner

*Primary Examiner* — Zachary M Pape
(74) *Attorney, Agent, or Firm* — Daly, Crowley, Mofford & Durkee, LLP

(57) ABSTRACT

A cooling module includes a thermally conductive plate, a bladder disposed on at least one side of the plate, the bladder have a chamber, and fluid disposed in the chamber of the bladder wherein the bladder in an inflated state impresses the cooling module against an adjacent electronic circuit card. where the cooling module is forcibly pressed against adjacent electronic circuit card providing increased physical stability to the electronic circuit card as well as provide a cooling technique for the circuit card.

5 Claims, 5 Drawing Sheets

PASSIVE CONDUCTIVE COOLING MODULE

FIELD OF THE INVENTION

This invention relates generally to ruggedized electronic equipment and more particularly to ruggedized electronic assemblies using conduction cooling.

BACKGROUND OF THE INVENTION

To prevent electronic equipment from over heating, there are many existing methods to help control thermal management. The simplest is allowing abundant airflow through a card chassis to cool electronic cards directly by convection. In environments where convection is impossible or impractical, individual cards may be built on a thermally conductive frame so that heat is conducted away from the card components to the enclosing chassis. In extreme cases of thermal management, spray cooling may be used to bathe circuit cards directly in a liquid coolant. In some systems, a heat sink or liquid-cooled heat exchanger is attached directly to the body of the electronic component that generates the heat.

Electronics assemblies must overcome the increasing challenge of heat rejection and thermal management. COTS (commercial off the shelf) computer processors and circuit cards offer ever-increasing levels of processing power, but require correspondingly larger power inputs and produce more heat. It is becoming increasingly difficult to properly cool these cards, especially in compact installations or in adverse environment. It is desirable to use COTS circuit cards that often lack the physical ruggedization required for use in a military environment as well as manage the thermal challenges of modern equipment.

SUMMARY OF THE INVENTION

In accordance with the present invention, a cooling module includes a thermally conductive plate, a bladder disposed on at least one side of the plate, the bladder have a chamber, and fluid disposed in the chamber of the bladder wherein the bladder in an inflated state impresses the cooling module against an adjacent electronic circuit card. With such an arrangement, the cooling module is forcibly pressed against adjacent electronic circuit card providing increased physical stability to the electronic circuit card as well as provide a cooling mechanism for the circuit card.

In accordance with the present invention, a cooling module adapted to fit between two rack mounted electronic assemblies includes a thermally conductive plate, a bladder disposed on one side of the plate, the bladder having an inflated state and a deflated state, the bladder having a chamber with fluid disposed in the chamber and radiative fins disposed on an opposite side of the plate adapted to receive abundant airflow through the cooling module to cool electronic assemblies directly by convection when the bladder in an inflated state impresses the cooling module against the electronic assemblies to provide additional stability against vibration. With such an arrangement, additional cooling is provided to the electronic assemblies as well as provide ruggardization and additional resistant to shock and vibration to the electronic assemblies.

BRIEF DESCRIPTION OF THE DRAWINGS

The foregoing features of this invention, as well as the invention itself, may be more fully understood from the following description of the drawings in which.

DETAILED DESCRIPTION OF THE INVENTION

Figure 1:
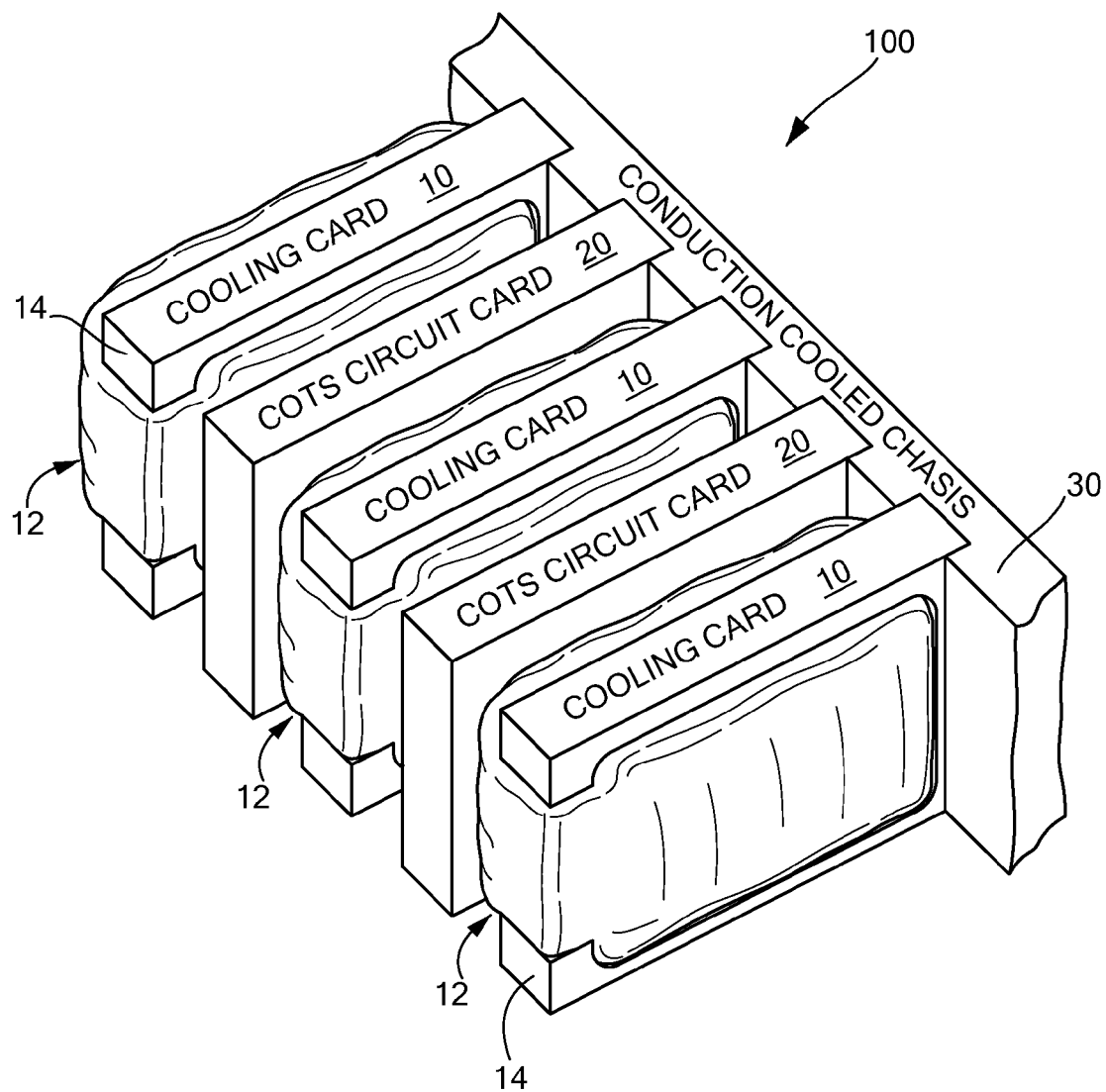
FIG. 1 is an isometric view of an electronic system with a cooling card and a COTS circuit card according to the invention.

Referring now to FIG. 1, an electronic assembly 100 is shown to include a cooling module 10 (sometimes also referred to as a cooling card) and a circuit card 20 disposed on a conduction cooled chassis 30. The cooling module 10 includes a flexible bladder 12 filled with thermally conductive fluid (i.e. coolant) and a thermally conductive plate 14. A circuit card 20 is disposed next to a cooling module 10 with the circuit card 20 between two cooling modules 20. This arrangement provides a technique for cooling high-power circuit cards in a conduction-cooled assembly as well as provide additional ruggardization for the circuit cards. It should be noted that this technique allows for adequate cooling of unmodified COTS circuit cards in a ruggedized or thermally challenging environment, i.e. military environment. The cooling card 10 can be a "dummy" card that fits into a single slot in the electronics chassis 30. The cooling module or card 10 has a conduction-cooled plate or frame 14 for transferring heat to the enclosing chassis. Each side of the card 10 has a flexible bladder 12 filled with a thermally conductive liquid coolant. After the card 10 is inserted into the chassis between two high-powered electronics cards 20, the bladders are inflated such that they are in contact with the thermal components of the adjacent circuit cards 20. In operation, the liquid coolant in the bladders 12 absorbs thermal energy by conduction from the adjacent circuit cards 20, and transfers that energy to the thermal frame 14 of the "dummy" card or cooling module 10, which in turn transfers the heat to the chassis 30. The chassis 30 provides its own cooling mechanism, beyond the scope of this invention. In addition to providing cooling, the inflated coolant bladders 12 "sandwich" the COTS circuit cards 20, providing increased physical stability, ruggedization, and resistance to shock and vibration. Another embodiment of the invention as described in connection with FIG. 3 allows the coolant of a liquid-cooled chassis to circulate within the "dummy" card or cooling module 10, reducing the need for conductive cooling of a thermal frame.

It should now be appreciated that commercial of the shelf circuit cards can be used in a ruggedized system using such a technique. The latter can be used with a closed-system liquid cooling environment and is a solution for any chassis-mounted electronics. It provides full-face cooling of another card, including a COTS card designed for simple convection cooling. It is removable, reusable cooling that is not dependent on the type of card being cooled and as described it provides structural stability to adjacent cards. It requires no modifications to COTS circuit cards in rugged systems and is fully compatible with typical conduction-cooled chassis.

Figure 2:
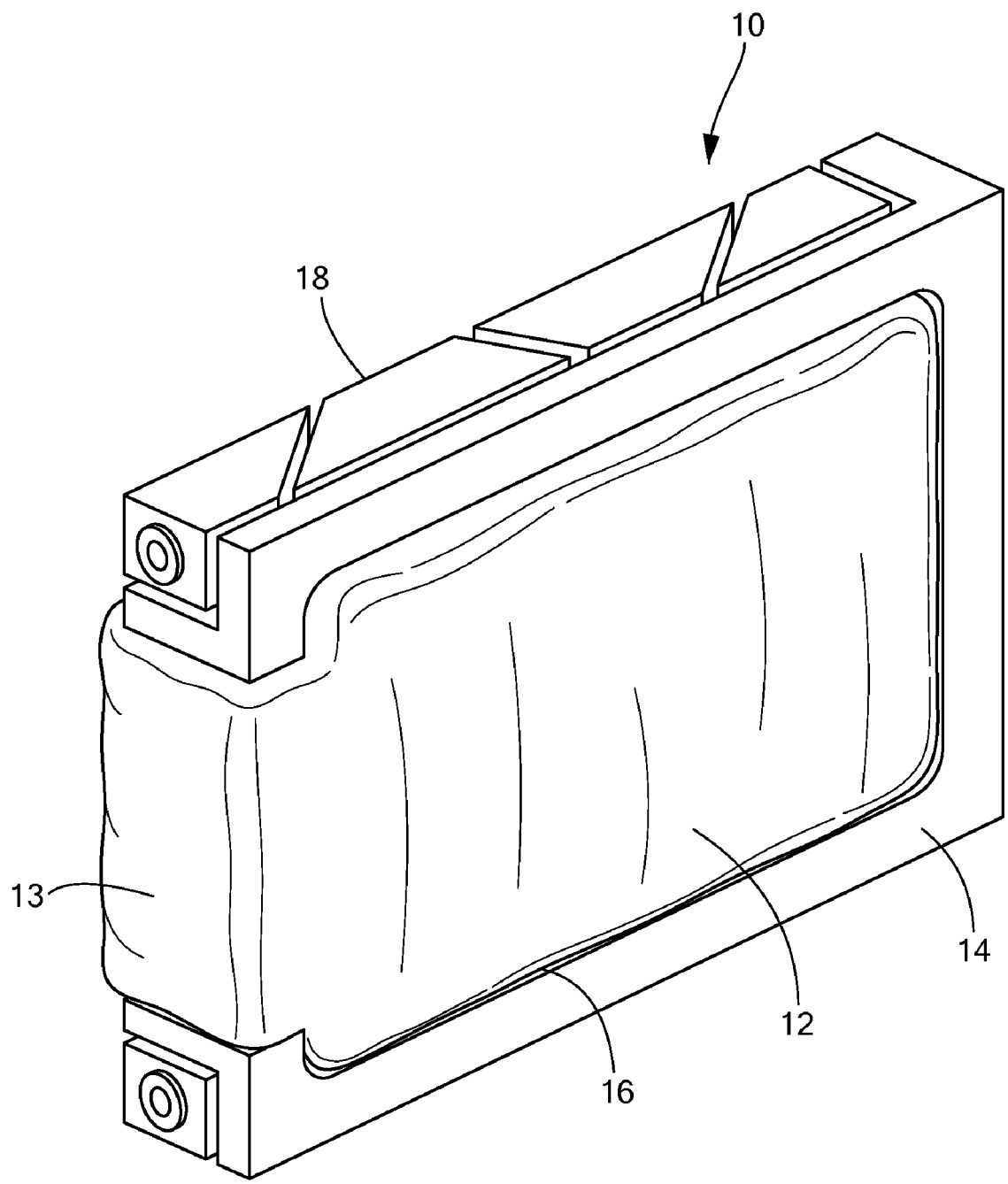
FIG. 2 is an isometric view of a cooling card according to the invention.

Referring now to FIG. 2, a more detailed figure of the cooling module 10 is shown. The card frame 14 includes thermal clamps 18 to clamp the cooling module 10 to the chassis 30. The bladder 12 is a surface mounted polymer coolant bag disposed on the card frame 14 as shown. the coolant bag wraps around the edge 13 of the card frame 14. The card frame 14 includes a chamfered edge 16 to accommodate the coolant bag. In a deflated mode, internal retraction mechanism contracts the bladder 12 to allow removal of circuit cards 20 from the chassis. The cooling card 10 is inserted between two circuit cards 20. The chassis cover plate compresses the coolant bag (bladder 12) on the front edge 13 of the card 10 which inflates the bladder 12 so that it makes contact with the adjacent card surfaces of the circuit cards 20. It should be appreciated that the bladder may be fabricated from any puncture resistant and heat capable material such as a polymer or silicon material. The fluid located in the bladder 12 can be any coolant material including an inert fluorine.

Figure 3:
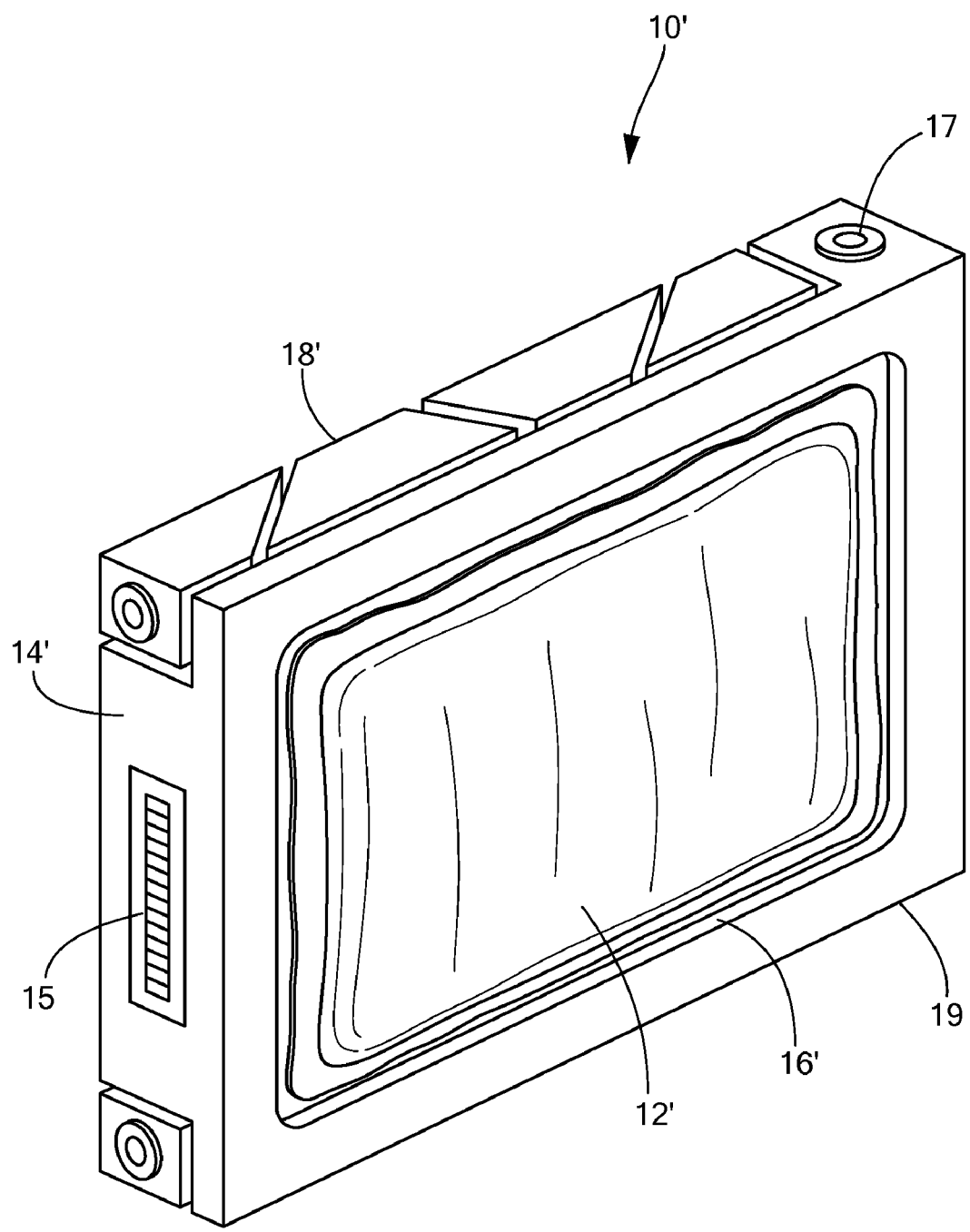
FIG. 3 is an isometric view of an alternative embodiment of a cooling card according to the invention.

Referring now to FIG. 3, an alternative embodiment of the cooling module 10' is shown. In this embodiment, the cooling module 10' is meant to be used with a coolant flowing system. The card frame 14' includes thermal clamps 18' to clamp the cooling module 10' to the chassis 30. In this embodiment, an separate bladder 12' is disposed on each side of the frame 14' and is a surface mounted polymer coolant bag disposed on the card frame 14' as shown. The card frame 14' includes a chamfered edge 16' to accommodate the coolant bag or bladder 12'. A coolant inlet port 17 is provided as shown and a coolant outlet port 19 is disposed on the underside of the frame 14'. A surface mount liquid crystal thermometer 15 is provided as shown. In operation, the coolant inflow inflates the bladder 12' and bladder 12' makes physical contact with the adjacent circuit cards. The coolant flowing system delivers coolant to the inlet port 17 and accepts flow from the outlet port 19. In a deflated mode, the bladder 12' is retracted to allow removal of circuit cards 20 from the chassis.

Figure 3B:
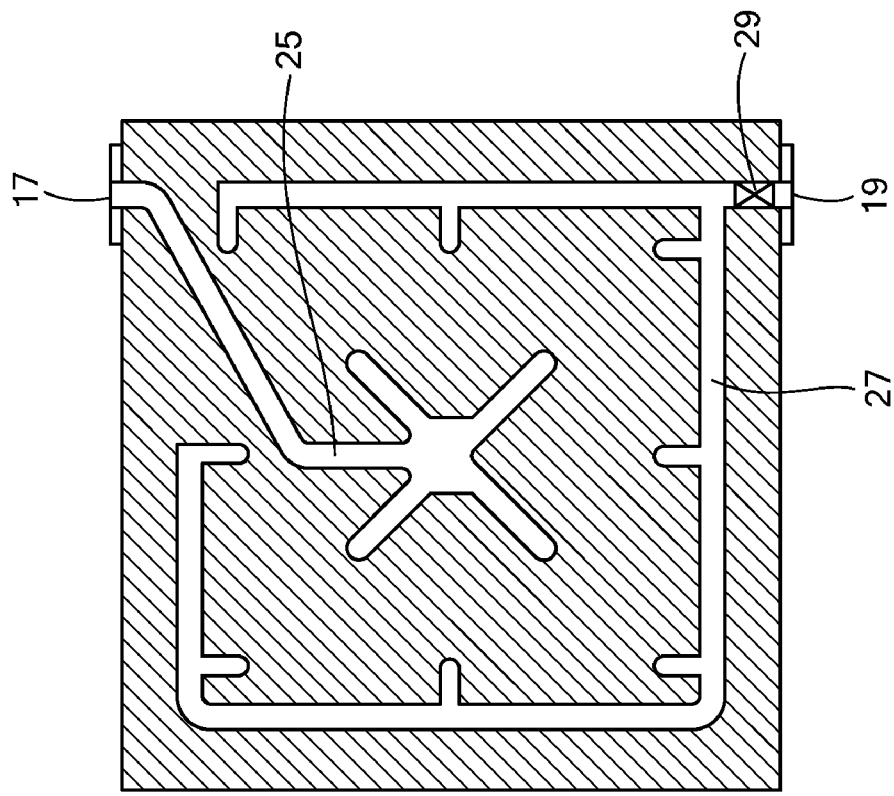
FIG. 3B is a cut away view of the cooling plate used in the cooling card of FIG. 3 according to the invention.
Figure 3A:
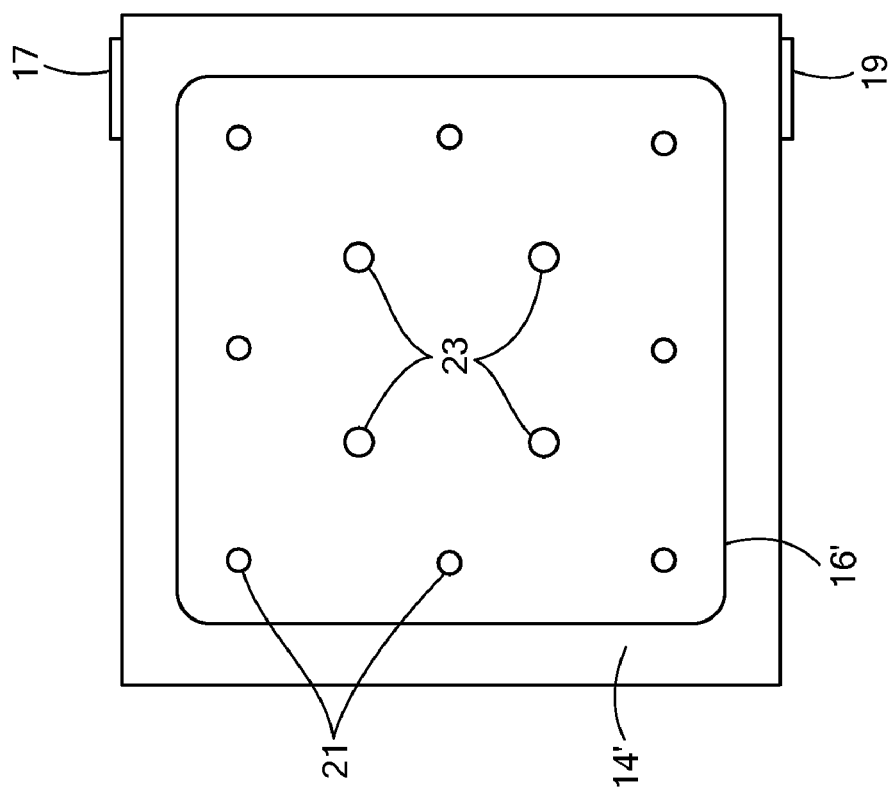
FIG. 3A is a plan view of one side of the cooling plate used in the cooling card of FIG. 3 according to the invention.

Referring now to FIGS. 3A and 3B, the frame 14' behind the bladder 12' is shown in FIG. 3A and a cut away view of the frame 14' is shown in FIG. 3B. The inlet port 17 is connected to coolant supply channels 25 which are connected to coolant injection ports 23, here having four in number. The outlet port 19 is connected to coolant recovery channels 27 which are connected to coolant recovery ports 21, here having eight in number. A pressure relief valve 29 is provided at the coolant outlet port 19. As described, the coolant flowing system delivers coolant to the inlet port 17 and accepts flow from the outlet port 19.

Figure 4:
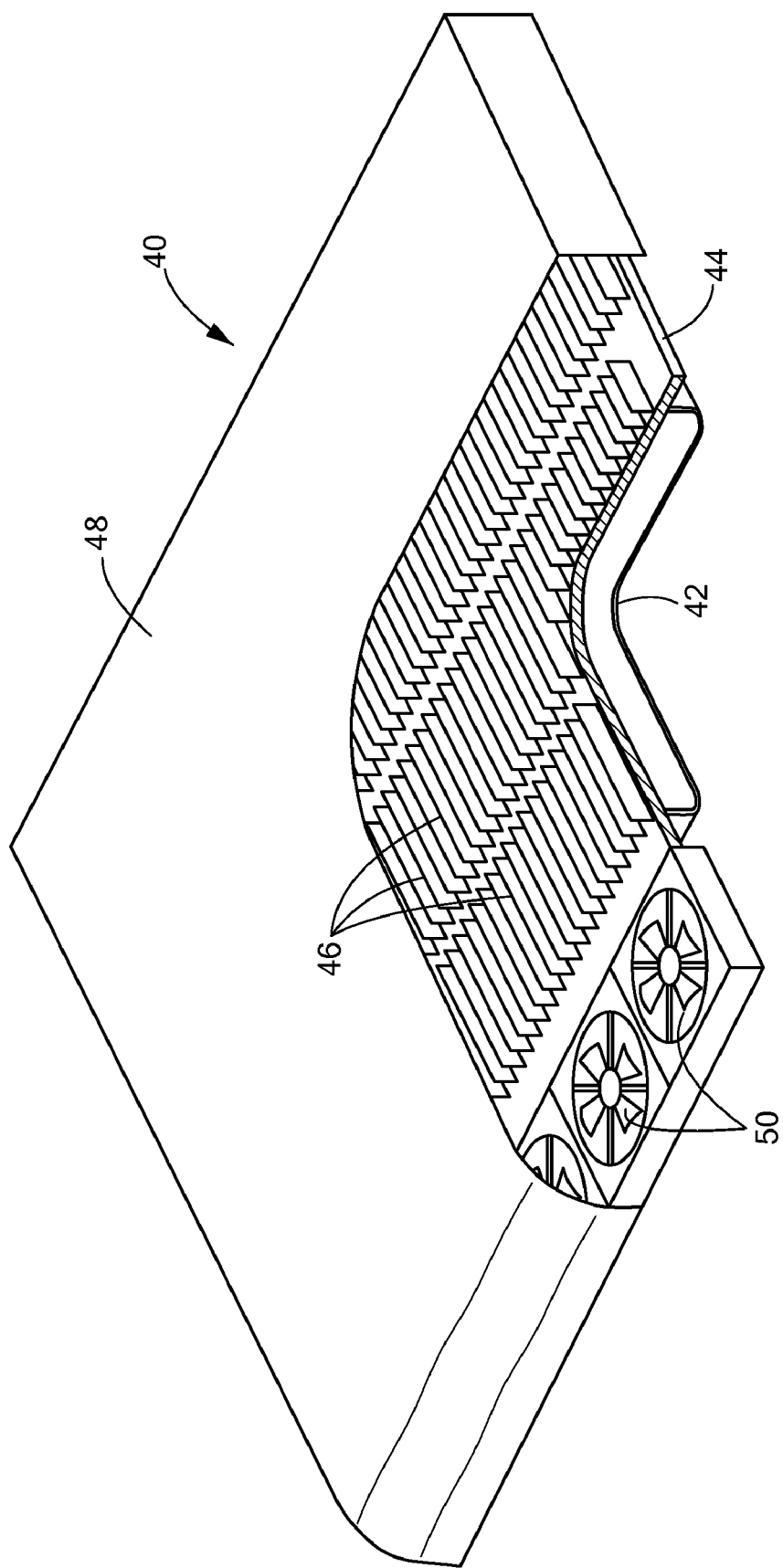
FIG. 4 is an isometric view of a cooling card used in a rack mount that would be disposed between two rack mounted devices according to the invention.

Referring now to FIG. 4, an alternative embodiment of a cooling module 40 is shown. The cooling module 40 includes a flexible bladder 42 filled with thermally conductive fluid (i.e. coolant) and a thermally conductive plate 44. On an opposite side of the conductive plate 44, a plurality of radiative fins 46 are disposed as shown. Disposed over the plurality of radiative fins 46 is an airflow shroud 48. Additionally a plurality of fans 50 are included to provide air flow over the radiative fins 46. This embodiment is a cooling module adapted to fit between two rack mounted electronic assemblies to cool the electronic assemblies directly by convection and when the bladder in an inflated state impresses the cooling module against the electronic assemblies to provide additional stability against vibration.

Having described various embodiments of the invention, it should now be appreciated that a cooling module according to the present invention includes a thermally conductive plate, a bladder disposed on at least one side of the plate, the bladder have a chamber; and fluid disposed in the chamber of the bladder. The cooling module may include a bladder where a portion of the bladder is wrapped around an end of the plate wherein the bladder is adapted to inflate when a cover is pressed against the portion of the bladder wrapped around the end of the plate. It is desirable for the fluid to have a high thermal conductivity characteristic. Furthermore, the thermally conductive plate includes a plurality of apertures disposed through the plate allowing fluid to pass from a portion of the bladder on one side of the plate to a portion of the bladder on the other side of the plate. The cooling module is adapted to fit between two electronic assemblies and when the bladder in an inflated state, the cooling module is impressed against the electronic assemblies to provide additional stability against vibration.

Having described the preferred embodiments of the invention, it will now become apparent to one of ordinary skill in the art that other embodiments incorporating their concepts may be used. It is felt therefore that these embodiments should not be limited to disclosed embodiments but rather should be limited only by the spirit and scope of the appended claims.

What is claimed is:

1. An apparatus comprising:
 a conduction cooled chassis;
 at least one electronic circuit card disposed on the conduction cooled chassis;
 at least one cooling module disposed on the conduction cooled chassis and adjacent at least one electronic circuit card, the cooling module comprising:
  a thermally conductive plate;
  a bladder disposed on at least one side of the plate, the bladder having a chamber; and
  fluid disposed in the chamber of the bladder wherein the bladder in an inflated state compresses a portion of the bladder of the cooling module against the electronic circuit card; and
  wherein the thermally conductive plate includes a coolant supply channel connected to an input port and coolant injection ports exiting into the chamber and a coolant recovery channel connected to an output port and coolant recovery ports entering from the chamber, the chamber connected with the coolant injection ports and the coolant recovery ports to pass fluid with the chamber, a portion of the coolant supply channel being proximal to a center portion of the thermal conductive plate and the coolant recovery channel being disposed around the portion of the coolant supply channel; and
 a second cooling module disposed on the conduction cooled chassis and adjacent the at least one electronic circuit card wherein the at least one cooling module and the second cooling module sandwich the at least one electronic circuit card when the bladder is in an inflated state.

2. The apparatus as recited in claim 1 wherein the volume of fluid in the chamber is controlled by the amount of fluid fed into the input port from an external source and released by the output port to the external source.

3. A cooling module comprising:
 a thermally conductive plate having a coolant supply channel connected to an input port and coolant injection ports and a coolant recovery channel connected to an output port and coolant recovery ports, the coolant supply channel and coolant recovery channel disposed within the thermally conductive plate, a portion of the coolant supply channel being proximal to a center portion of the thermal conductive plate and the coolant recovery channel being disposed around the portion of the coolant supply channel; and
 a bladder disposed on at least one side of the plate, the bladder having a chamber connected with the coolant injection ports and the coolant recovery ports; and
 fluid disposed in the chamber of the bladder, the volume of fluid controlled by the amount of fluid fed into the input port from an external source and released by the output port to the external source wherein the bladder is inflatable to expand to make contact with an adjacent circuit card.

4. The cooling module as recited in claim 3 wherein a second bladder is disposed on an opposing side of the plate.

5. The cooling module as recited in claim 3 comprising a pressure relief valve connected to the output port.

* * * * *